United States Patent
Kim et al.

(10) Patent No.: US 9,461,900 B2
(45) Date of Patent: Oct. 4, 2016

(54) SIGNAL PROCESSING APPARATUS AND SIGNAL PROCESSING METHOD THEREOF

(71) Applicants: SAMSUNG ELECTRONICS CO., LTD., Suwon-si (KR); KWANGWOON UNIVERSITY INDUSTRY-ACADEMIC COLLABORATION FOUNDATION, Seoul (KR)

(72) Inventors: Min-sung Kim, Suwon-si (KR); Hyoung-Gook Kim, Seoul (KR); Houng-sog Min, Ansan-si (KR); Jae-sung Park, Gunpo-si (KR)

(73) Assignees: SAMSUNG ELECTRONICS CO., LTD., Suwon-si (KR); KWANGWOON UNIVERSITY INDUSTRY-ACADEMIC COLLABORATION FOUNDATION, Seoul (KR)

( * ) Notice: Subject to any disclaimer, the term of this patent is extended or adjusted under 35 U.S.C. 154(b) by 115 days.

(21) Appl. No.: 14/085,149

(22) Filed: Nov. 20, 2013

(65) Prior Publication Data

US 2014/0146695 A1 May 29, 2014

(30) Foreign Application Priority Data

Nov. 26, 2012 (KR) .................. 10-2012-0134826

(51) Int. Cl.

| | |
|---|---|
| *H04L 12/26* | (2006.01) |
| *H04L 29/06* | (2006.01) |
| *G10L 19/005* | (2013.01) |
| *G10L 19/12* | (2013.01) |
| *H04L 12/805* | (2013.01) |
| *H04L 12/815* | (2013.01) |
| *H04N 21/439* | (2011.01) |
| *G01R 31/317* | (2006.01) |

(52) U.S. Cl.
CPC ........... *H04L 43/087* (2013.01); *H04L 65/601* (2013.01); *H04L 65/80* (2013.01); *G01R 31/31709* (2013.01); *G10L 19/005* (2013.01); *G10L 19/12* (2013.01); *H04L 43/106* (2013.01); *H04L 43/16* (2013.01); *H04L 47/22* (2013.01); *H04L 47/365* (2013.01); *H04N 21/4392* (2013.01); *H04N 21/4394* (2013.01); *H04N 21/4396* (2013.01); *H04N 21/4398* (2013.01)

(58) Field of Classification Search
None
See application file for complete search history.

(56) References Cited

U.S. PATENT DOCUMENTS

| | | | | |
|---|---|---|---|---|
| 4,748,620 | A * | 5/1988 | Adelmann et al. | 370/394 |
| 5,502,713 | A * | 3/1996 | Lagerqvist et al. | 370/252 |
| 6,044,341 | A * | 3/2000 | Takahashi | 704/226 |
| 6,272,459 | B1 * | 8/2001 | Takahashi | 704/221 |
| 6,654,432 | B1 * | 11/2003 | O'Shea et al. | 375/354 |
| 6,744,757 | B1 * | 6/2004 | Anandakumar et al. | 370/352 |
| 6,775,649 | B1 * | 8/2004 | DeMartin | 704/201 |

(Continued)

*Primary Examiner* — Bunjob Jaroenchonwanit
(74) *Attorney, Agent, or Firm* — Sughrue Mion, PLLC

(57) ABSTRACT

A signal processing apparatus which processes a voice packet is provided. The signal processing apparatus includes: a network jitter measurer which estimates network jitter using a weighting of a network jitter variance according to a network state, a compression and output unit which compresses or outputs a voice frame based on the estimated network jitter, and a loss concealer which divides a voice packet loss into short-term loss concealment and long-term loss concealment, and performs loss concealment in a different way depending on whether the voice packet loss is the short-term loss concealment or the long-term loss concealment.

20 Claims, 10 Drawing Sheets

(56) References Cited

U.S. PATENT DOCUMENTS

| | | | |
|---|---|---|---|
| 7,720,959 B2* | 5/2010 | Karam et al. | 709/224 |
| 7,773,536 B2* | 8/2010 | Lloyd et al. | 370/252 |
| 8,279,884 B1* | 10/2012 | Narasimha et al. | 370/412 |
| 8,456,991 B2* | 6/2013 | Viswanathan et al. | 370/232 |
| 8,849,091 B2* | 9/2014 | Kato | 386/241 |
| 2002/0123887 A1* | 9/2002 | Unno | 704/220 |
| 2003/0035384 A1* | 2/2003 | Cline et al. | 370/286 |
| 2004/0081106 A1* | 4/2004 | Bruhn | 370/276 |
| 2005/0010401 A1* | 1/2005 | Sung et al. | 704/219 |
| 2005/0107981 A1* | 5/2005 | Chiang | 702/179 |
| 2005/0149296 A1* | 7/2005 | Sieracki | 702/189 |
| 2005/0228651 A1* | 10/2005 | Wang et al. | 704/207 |
| 2006/0045138 A1* | 3/2006 | Black et al. | 370/516 |
| 2006/0215669 A1* | 9/2006 | Gangadharan et al. | 370/401 |
| 2007/0121597 A1* | 5/2007 | Lee et al. | 370/356 |
| 2007/0282601 A1* | 12/2007 | Li | 704/207 |
| 2008/0201468 A1* | 8/2008 | Titus | 709/224 |
| 2008/0243277 A1* | 10/2008 | Kadel | 700/94 |
| 2008/0243495 A1* | 10/2008 | Anandakumar et al. | 704/214 |
| 2009/0019343 A1* | 1/2009 | Tashiro | 714/799 |
| 2009/0119098 A1* | 5/2009 | Zhan et al. | 704/219 |
| 2009/0180432 A1* | 7/2009 | Harada et al. | 370/329 |
| 2009/0304032 A1* | 12/2009 | Florencio et al. | 370/516 |
| 2009/0326950 A1* | 12/2009 | Matsumoto | 704/265 |
| 2010/0091748 A1* | 4/2010 | Endoh | 370/338 |
| 2010/0260074 A1* | 10/2010 | Blouin et al. | 370/260 |
| 2011/0077940 A1* | 3/2011 | Vos et al. | 704/229 |
| 2011/0208517 A1* | 8/2011 | Zopf | G10L 21/04 704/211 |
| 2011/0214157 A1* | 9/2011 | Korsunsky et al. | 726/1 |
| 2012/0014276 A1* | 1/2012 | Andreasson et al. | 370/252 |
| 2012/0239389 A1* | 9/2012 | Jeon et al. | 704/208 |
| 2012/0250678 A1* | 10/2012 | Sabella et al. | 370/352 |
| 2012/0323567 A1* | 12/2012 | Gao | 704/201 |
| 2013/0295921 A1* | 11/2013 | Bhargava et al. | 455/426.1 |
| 2014/0052439 A1* | 2/2014 | Rose et al. | 704/219 |
| 2014/0135068 A1* | 5/2014 | Anandakumar et al. | 455/563 |

* cited by examiner

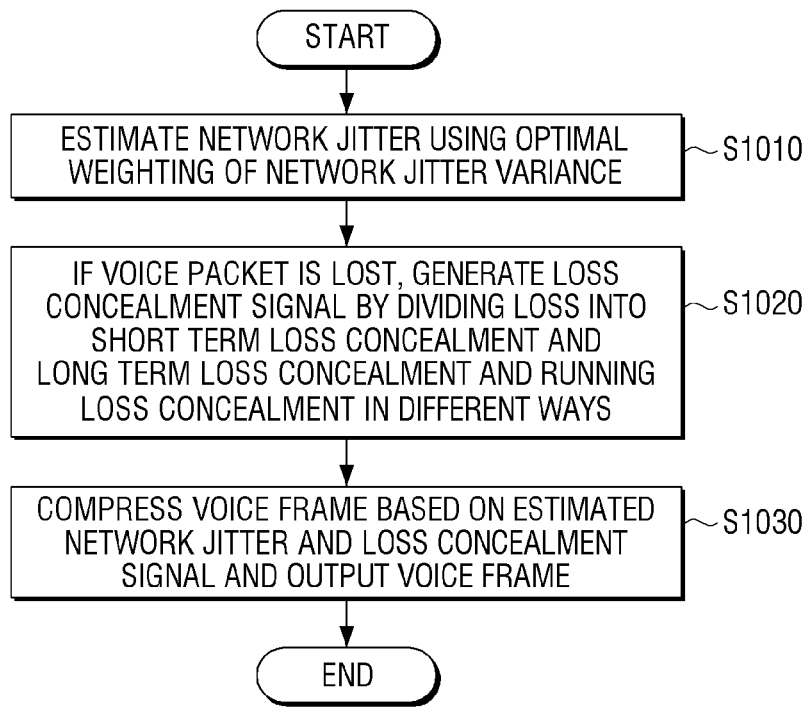

SIGNAL PROCESSING APPARATUS AND SIGNAL PROCESSING METHOD THEREOF

CROSS-REFERENCE TO RELATED APPLICATION

This application claims priority from Korean Patent Application No. 10-2012-0134826, filed on Nov. 26, 2012, in the Korean Intellectual Property Office, the disclosure of which is incorporated herein by reference in its entirety.

BACKGROUND

1. Field

Methods and apparatuses consistent with exemplary embodiments relate to a signal processing apparatus, which receives a mobile voice over IP (VoIP)-based voice packet and processes the voice packet, and a signal processing method thereof.

2. Description of the Related Art

If voice data is transmitted through a VoIP-based packet network, packets arrive at a receiving end at irregular intervals, because each packet is transmitted through a different path rather than a same path. In other words, the packets may be lost due to a network load, and the packets may not be received within a fixed time, or may be received in a different order from that when they are transmitted. Therefore, sound quality may deteriorate.

In order to estimate jitter, which may cause such sound quality deterioration, a related-art method transmits a test packet to a network path and estimates jitter using a time stamp and sequence information of the test packet. Another related-art method for estimating network jitter calculates an average and a variance of jitter, using information on packets arriving at a receiving end, multiplies the variance by a fixed jitter variance weighting, and adds the product of the variance and the weighing and the average of the jitter, thereby estimating network jitter.

A related-art playout method to prevent voice quality from deteriorating due to a delay and jitter generated in a network, measures a network traffic during a predetermined time period, compares the network traffic with a threshold value, and performs one signal processing operation from among expanding, compression, and normal output with respect to a packet existing in a receiving end, thereby reducing a buffering delay. If a jitter buffer is expected to be used up, since a network delay is abruptly increased or the jitter buffer is expected to receive packets out of its packet receiving range, i.e., is expected to suffer from a underflow or overflow phenomenon since the network delay is abruptly reduced, the playout method performs expanding and compression.

Also, a related-art packet loss concealing method, which conceals a packet that is lost in a network and does not arrive at a receiving end, estimates a voice parameter regarding the lost packet based on a normally decoded previous packet, and decodes and uses the lost voice packet using the estimated parameter, or restores a lost voice frame by increasing pitch of a previous voice frame one by one using information of the previous frame of the lost frame.

However, the above-described methods may increase the buffering delay, and may cause sound quality to seriously deteriorate in a network situation which is dynamically changed or an abnormal network situation, such as spike. Also, during the signal processing operations such as compression, expanding, loss concealment, and combination, the sound quality may be damaged and may deteriorate. Accordingly, there is a demand for a method for solving an increased buffering delay and sound quality deterioration.

SUMMARY

One or more exemplary embodiments may overcome the above disadvantages and other disadvantages not described above. However, it is understood that one or more exemplary embodiment are not required to overcome the disadvantages described above, and may not overcome any of the problems described above.

One or more exemplary embodiments may provide a signal processing apparatus which can improve sound quality at a receiving end by performing adaptive playout scheduling and performing signal processing such as packet loss concealment and combination, and a signal processing method thereof.

According to an aspect of an exemplary embodiment, there is provided a signal processing apparatus which processes a voice packet, the signal processing apparatus including: a network jitter measurer which estimates network jitter using information on a received voice packet and a weighting of a network jitter variance; a loss concealer which divides a voice packet loss into short-term loss concealment and long-term loss concealment if there is the voice packet loss, and generates a loss concealment signal by performing loss concealment in a different way depending on whether the voice packet loss is the short-term loss concealment or the long-term loss concealment; and a compression and output unit which compresses or outputs a voice frame based on the estimated network jitter and the loss concealment signal.

The signal processing apparatus may further include a decoder which decodes the received voice packet and generates the voice frame, and the loss concealer may be separated from the decoder, and may restore the voice packet loss regardless of a type of the decoder.

The network jitter measurer may detect a spike state in which the network jitter is abruptly changed using header information of the received voice packet and the weighting of the jitter variance, and the compression and output unit may compress or output the voice frame using the detected spike state.

The weighting of the jitter variance may be a weighting that minimizes a difference between previously estimated network jitter and currently generated network jitter.

The network jitter measurer may divide a network state into a spike state and a normal state, and may minimize a jitter estimating error using a jitter average and the network jitter variance according to each network state, and the weighting of the jitter variance.

The network jitter measurer may detect a change from the normal state to the spike state using information on a normally received packet, may temporarily store an average and a variance of the network jitter in a previous normal state when detecting the spike state, may estimate jitter of the normal state using the average and the variance of the network jitter temporarily stored when the spike state is changed to the normal state, and may calculates the weighting of the jitter variance by calculating an error between the network jitter estimated in each of the normal state and the spike state, and a real network jitter.

The compression and output unit may compress the voice frame according to whether a spike state is changed to a normal state or a normal state is maintained, may divide the voice frame into a non-voice section and a voice section when compressing the voice frame, and may not compress the voice section and may compress the non-voice section.

The compression and output unit may search a continuous non-voice section of an output voice frame buffer and a jitter buffer if the spike stat is changed to the normal state, and may compress the continuous non-voice section such that a buffering delay is reduced.

If the voice packet loss corresponds to the short-term loss concealment, and, if the voice frame does not exist after a lost voice frame, the loss concealer may restore the lost voice frame using only a pre-loss voice frame, and, if the voice frame exists after the lost voice frame, the loss concealer may restore the lost voice frame using a pre-loss voice frame and a post-loss voice frame Also, if the post-loss voice frame does not exist in the voice frame, the loss concealer may search a post-loss voice frame in a jitter buffer, may decode the voice frame, and may use the voice frame to restore the lost voice frame.

If the pre-loss frame used for the short-term loss concealment is an unvoiced sound, the loss concealer may apply an unvoiced sound removal scaling function, which is reduced with a slope more than a predetermined threshold value, and, if the pre-loss frame is a voiced sound, the loss concealer may not apply the unvoiced sound removal scaling function.

If the voice packet loss corresponds to the long-term loss concealment, the loss concealer may divide a voice section into a voiced sound section and an unvoiced sound section, and may apply a removal scaling function corresponding to each section of the voiced sound section and the unvoiced sound section.

The signal processing apparatus may further include a combiner which extracts a sub-frame from a normally received voice frame, and generates a combined voice frame by combining the voice frame which is loss-concealed by the loss concealer and the extracted sub-frame.

The voice packet may be a voice communication packet according to a VoIP.

According to another aspect of an exemplary embodiment, there is provided a method for processing a signal, which processes a voice packet, the method including: estimating network jitter using information on a received voice packet and a weighting of a network jitter variance; dividing a voice packet loss into short-term loss concealment and long-term loss concealment if there is the voice packet loss, and generates a loss concealment signal by performing loss concealment in a different way depending on whether the voice packet loss is the short-term loss concealment or the long-term loss concealment; and compressing or outputting a voice frame based on the estimated network jitter and the loss concealment signal.

The method may further include decoding the received voice packet and generating the voice frame, and the generating the loss concealment signal may be performed separately from the decoding, and may include restoring the voice packet loss regardless of a type of a decoder.

The estimating the network jitter may include detecting a spike state in which the network jitter is abruptly changed using header information of the received voice packet and the weighting of the jitter variance, and the compressing or outputting may include compressing or outputting the received voice frame using the detected spike state.

The weighting of the jitter variance may be a weighting that minimizes a difference between previously estimated network jitter and currently generated network jitter.

The estimating the network jitter may include dividing a network state into a spike state and a normal state, and minimizing a jitter estimating error using a jitter average and the network jitter variance according to each network state, and the weighting of the jitter variance.

The estimating the network jitter may include: detecting a change from the normal state to the spike state using information on a normally received packet; temporarily storing an average and a variance of the network jitter in a previous normal state when detecting the spike state, and estimating jitter of the normal state using the average and the variance of the network jitter temporarily stored when the spike state is changed to the normal state; and calculating the weighting of the jitter variance by calculating an error between the network jitter estimated in each of the normal state and the spike state and a real network jitter.

The compressing and outputting may include compressing the voice frame according to whether a spike state is changed to a normal state or a normal state is maintained, dividing the voice frame into a non-voice section and a voice section when compressing the voice frame, and not compressing the voice section and compressing the non-voice section.

According to another aspect of an exemplary embodiment, there is provided a method of determining a signal processing, the method including: determining whether a voice frame to be currently output is stored; performing short-term loss concealment or long-term loss concealment when the voice frame to be currently output is not stored; determining whether a previous voice frame is lost when the voice frame to be currently output is stored; simultaneously obtaining a normally received voice frame and a loss-concealed voice frame from the stored voice frame to be currently output when the previous voice frame is lost; and optimizing buffering delay by compressing the voice frame to be currently output or outputting the voice frame to be currently output without compression, when the previous frame has not been lost and is not concealed.

According to the above-described exemplary embodiments, in voice and video communication based on a VoIP, reception sound quality can be improved using only signal processing at the receiving end, such as adaptive playout scheduling, packet loss concealment, and combination, in spite of voice quality damaging factors, such as packet loss, packet delay, and jitter which is a network delay variance, which may be caused by a change in an IP network.

BRIEF DESCRIPTION OF THE DRAWINGS

The above and/or other aspects will be more apparent by describing in detail exemplary embodiments, with reference to the accompanying drawings, in which:

FIG. 10 is a flowchart illustrating a signal processing method according to an exemplary embodiment.

DETAILED DESCRIPTION OF EXEMPLARY EMBODIMENTS

Figure 1:
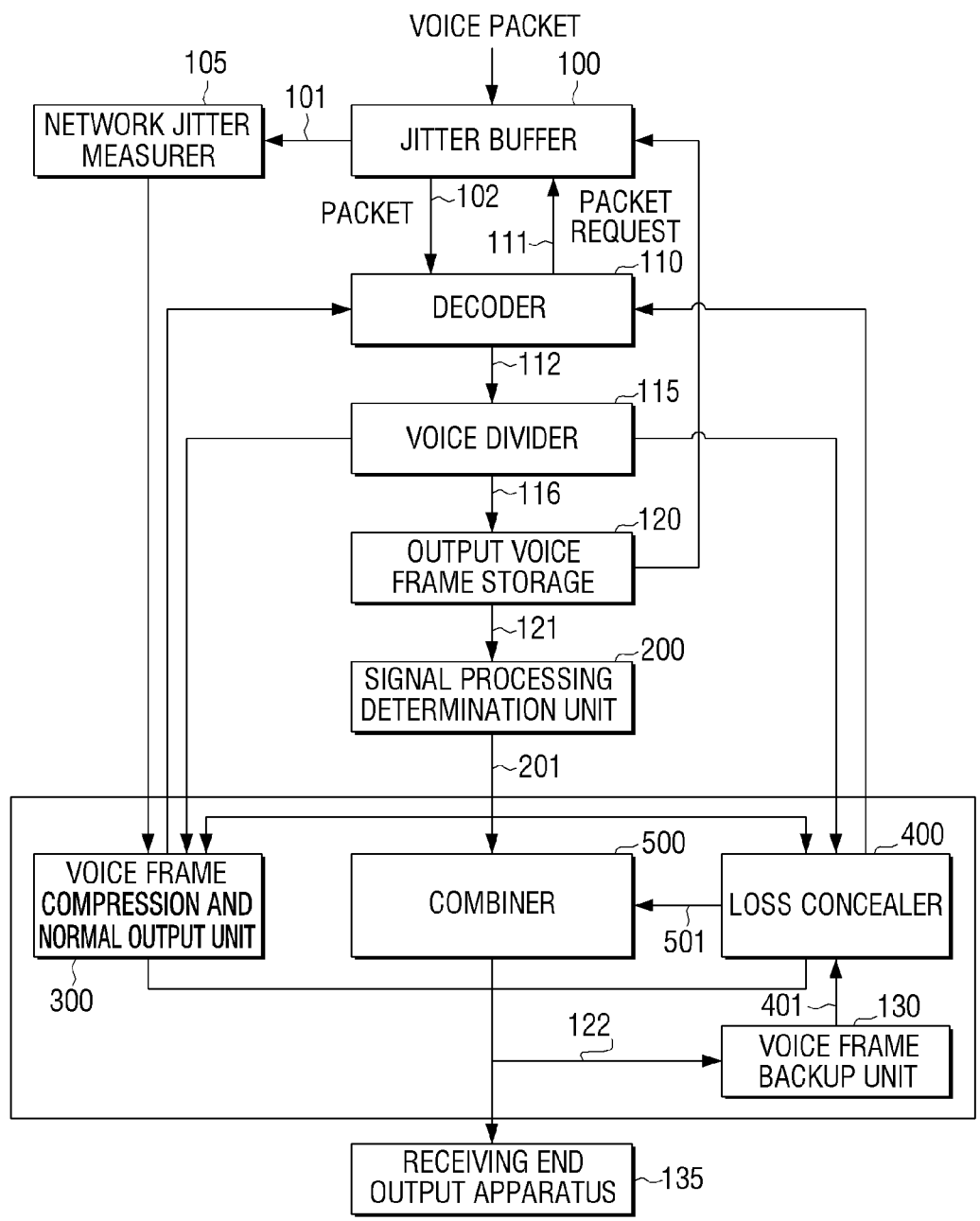
FIG. 1 is a block diagram illustrating a signal processing apparatus according to an exemplary embodiment.

Hereinafter, exemplary embodiments will be described in greater detail with reference to the accompanying drawings.

In the following description, same reference numerals are used for the same elements when they are depicted in different drawings. The matters defined in the description, such as detailed construction and elements, are provided to assist in a comprehensive understanding of exemplary embodiments. Thus, it is apparent that exemplary embodiments can be carried out without those specifically defined matters. Also, functions or elements known in the related art are not described in detail since they would obscure the exemplary embodiments with unnecessary detail.

Methods and apparatuses consistent with exemplary embodiments relate to a signal processing method of a receiving end, which can improve mobile VoIP sound quality by applying adaptive playout scheduling and packet loss concealment and combination. The signal processing method of the receiving end has the following distinct features:

First, unlike a related-art method in which a packet loss concealer is connected to an audio decoder of a receiving end, a method according to an exemplary embodiment separates a packet loss concealer from a decoder, so that the packet loss concealer can be effectively applied to various audio codecs.

Second, unlike a related-art method in which a sending end adjusts a packet size based on a network traffic measurement value, measured using information on a packet arriving at a receiving end, and transmits a packet to the receiving end, a method according to an exemplary embodiment improves sound quality at a receiving end using only information on a packet arriving at the receiving end.

Third, unlike a related-art method that estimates jitter by applying a fixed jitter variance weighing to a variance and an average of network jitter, a method according to an exemplary embodiment divides a current network state into a spike state and a normal state, calculates an optimal weighting of a jitter variance according to the state, and estimates network jitter by applying an optimal weighting function of the jitter variance according to each network state based on the calculated optimal weighting, such that a jitter estimating error can be minimized in a spike state or a dynamically changed network situation. Thus, jitter estimating accuracy can be improved.

Fourth, unlike a related-art method that determines whether to expand, compress, or normally output a voice frame considering a length of the received voice frame and delay information, a method according to an exemplary embodiment compares network jitter estimated at a receiving end and a length of a currently received voice frame, and determines whether to compress or normally output the voice frame using a result of the comparison, such that a buffering delay and a packet loss caused by the delay can be minimized.

Fifth, unlike a related-art expanding/compression/normal output method, a method according to an exemplary embodiment excludes expanding and determines whether to compress or normally output a voice frame. In other words, the related-art method performs expanding in order to prevent underflow, caused by exhaustion of packets when a network situation is not good. However, according to an exemplary embodiment, if packets are exhausted, it is determined that packets are lost and packet loss concealment is performed without performing expanding, such that an increase in a buffering delay caused by a length of a voice frame unnecessarily increased by expanding can be prevented. Thus, sound quality can be prevented from deteriorating.

Sixth, unlike a related-art method that performs compression without discriminating between a voice section and a non-voice section, a method according to an exemplary embodiment performs compression by discriminating between a voice section and a non-voice section, such that the voice section can be prevented from being compressed. Thus, sound quality deterioration caused by the compression of the voice section can be prevented.

Seventh, unlike a related-art method that performs compression among a plurality of packets, a method according to an exemplary embodiment performs compression among continuous packets in order to reduce a buffering delay caused by a plurality of packets arriving after spike, such that the buffering delay increased by the spike can be rapidly reduced.

Eighth, a method according to an exemplary embodiment divides a packet loss section into a short-term packet loss and a long-term packet loss, in order to remove a buzz sound that is generated by concealing a long-term continuous loss section using a pre-loss packet, and conceals each packet loss, such that sound quality can be improved.

Ninth, unlike a related-art method that distorts a normal voice packet by directly overlapping and adding a loss-concealed voice frame and a normally received voice frame, a method according to an exemplary embodiment generates a replacement signal by extracting a sub-frame from a normally received voice frame, and connects the replacement signal to a normally received voice frame by overlapping and adding the replacement signal with a loss concealment packet, such that the combination can be achieved without deforming the normally received voice packet. Thus, sound quality can be improved.

FIG. 1 is a block diagram illustrating a signal processing apparatus according to an exemplary embodiment.

Referring to FIG. 1, a signal processing apparatus at a receiving end, according to an exemplary embodiment, includes a jitter buffer 100, a network jitter measurer 105, a decoder 110, a voice divider 115, an output voice frame storage 120, a signal processing determination unit 200, a voice frame compression and normal output unit 300, a loss concealer 400, a combiner 500, a voice frame backup unit 130, and a receiving end output apparatus 135.

If a voice packet generated at a sending end is received through a communication module (not shown), the received voice packet is stored in the jitter buffer 100. An RTP header of the received voice packet includes a time stamp, a sequence number, and encoded voice information.

Information on the received voice packet is transmitted to the network jitter measurer 105 (101) at the same time that the received voice packet is stored in the jitter buffer 100, and the network jitter measurer 105 estimates network jitter of a next voice packet. In this case, in order to estimate network jitter exactly, the network jitter measurer 105 may divide a network state into a normal state, in which a variation of jitter is not greatly changed and jitter is changed within a predetermined range with reference to an average, and a spike state, in which a variance of jitter is greatly changed and jitter is changed out of the predetermined range from the average. Then, the network jitter measurer 105 may estimate jitter.

If a change in a network delay, which indicates how late a current packet arrives at the receiving end after a previous packet has arrived in an initial normal state, is greater than or equal to a spike detection threshold value, the network jitter measurer 105 determines that a spike occurs, and, if the change in the network delay is smaller than the spike detection threshold value, the network jitter measurer 105 determines that the normal state is maintained.

If it is determined that a spike occurs, the network jitter measurer 105 determines an end of the network normal state using a largest sequence from among sequences of packets received in the normal state before the spike is detected, and stores an average and a variance of jitter that are calculated in the normal state before the spike is detected. In this case, the average and the variance of the jitter stored may be used to detect a spike, when the normal state is restored after the spike has occurred. A sequence number of a packet that arrives at the time that the spike is detected is defined as a spike end point in order to detect a change from the spike state to the normal state, and a sequence number of a packet that arrives before the spike is detected is defined as a spike start point. In this case, a change to the normal state is detected according to two cases, with reference to the spike end point.

Specifically, if all packets between the spike start point and the spike end point arrive, the network jitter measurer 105 considers all packets that cannot come in due to the spike as arriving, and determines that the spike ends and the normal state is restored.

If packets after the spike come in, the network jitter measurer 105 defines a sequence number of the packet coming in after the spike as a spike end point, considers the spike section as being in progress, and expands the spike section. Then, if all packets of the expanded spike section come in, the network jitter measurer 105 determines that the spike ends and the normal state is restored.

Also, in order to prevent an error if a packet is lost due to the spike and all of the packets of the spike section do not come in, the network jitter measurer 105 defines a spike section detection threshold value using a change in the delay when the spike is detected, and estimates a maximum spike sustaining time using a range of the change of the delay when the spike starts. If the maximum spike sustaining time elapses and the normal state is not restored, it is determined that the normal state is restored after the maximum spike sustaining time.

If the spike state is changed to the normal state, the network jitter measurer 105 restores the average and the variance of the jitter in the normal state, until the spike occurs that are temporarily stored at the time that the spike is detected, and estimates jitter of the normal state without affecting jitter calculated in the spike state.

In this state, a process of estimating jitter is different according to a determined network situation. Jitter in the normal state is estimated by adding the product of a current jitter variance, which is a value estimating a jitter change, and an optimal weighting of the jitter variance, to a jitter average as explained in equation 1.

$$\text{Estimated jitter}=\text{current average of jitter}+\text{optimal weighting of jitter variance}*\text{current jitter variance} \quad \text{[Equation 1]}$$

Herein, the optimal weighing function of the jitter variance is a core factor that minimizes a jitter error. Also, the optimal weighting of the jitter variance is a weighting that minimizes a difference between a previously estimated jitter and a real jitter. In other words, if an optimal weighting of a previous jitter variance is equal to a previously calculated jitter variance, there is no change in the jitter. Thus, a previous maximum weighting is set as an optimal weighting of a jitter variance. If there is a change in the weighting, a ratio of a value after subtraction of a previous jitter average from a current jitter to a previous jitter variance is applied, as an optimal weighing value of a jitter variance as described in equation 3.

If the optimal weighting of the previous jitter variance is equal to the previously calculated jitter variance, the optimal weighting of the jitter variance is calculated by equation 2.

$$\text{Optimal weighting of jitter variance}=\text{previous maximum weighting} \quad \text{[Equation 2]}$$

On the other hand, if the optimal weighting of the jitter variance is not equal to the previously calculated jitter variance, the optimal variance weighting is calculated by equation 3.

$$\text{Optimal weighting of jitter variance}=(\text{current jitter}-\text{previous jitter average})/\text{previous jitter variance} \quad \text{[Equation 3]}$$

In the spike state, the packet may not be received due to an abnormal network state, and may be received in a changed order. In the spike state in which the packet is not received, the average and the variance of the jitter may be updated and the jitter may be estimated, as a result of the sudden abnormal network in the spike. Accordingly, the update of the average, the variance of the jitter, and the optimal weighting of the jitter variance in the spike section may cause the signal processing apparatus not to be adapted quickly to a network situation of the normal state when the normal state is restored.

Accordingly, in the spike state, the average and the variance of the jitter and the optimal jitter variance weighting of the normal state are not updated. When the spike section ends and is changed to the normal state, the signal processing apparatus is adapted quickly to the network situation using the average and the variance of the jitter and the optimal jitter variance weighing of the previous normal state.

The decoder 110 requests the voice packet from the jitter buffer 100 in order to transmit the received packet to an output apparatus (111). The jitter buffer 100 requested by the decoder 110 to transmit the voice packet designates a voice packet to be transmitted to the decoder 110 from among voice packets stored in a voice packet storage (not shown), with reference to the network jitter estimated by the network jitter measurer 105 and information on the voice packet stored in the jitter buffer 100. The designated voice packet is transmitted to the decoder 110 (102).

The decoder 110, which has received the voice packet, decodes the voice packet and generates a voice frame, and transmits the voice frame to the voice divider 115 (112). The generated voice frame is classified into one of a silence, an unvoiced sound, and a voiced sound through the voice divider 115. Then, the generated voice frame is transmitted to the output voice frame storage 120 (116).

The output voice frame storage 120 transmits a voice frame that has a sequence number to be transmitted to the output apparatus 135, from among the stored voice frames to the signal processing determination unit 200 (121), and the signal processing determination unit 200 determines which of signal processing operations of the compression and normal output unit 300, the loss concealer 400, and the combiner 500 will be performed with respect to the received voice frame (201). Configuration and operation of the signal processing determination unit 200 will be explained in detail below with reference to FIG. 2.

The voice frame which has been signal-processed by one of the voice frame compression and normal output unit 300, the loss concealer 400, and the combiner 500 is transmitted to the receiving end output apparatus 135, e.g., a speaker, and is transmitted to a user as a sound. Simultaneously, the voice frame is backed up and stored in the voice frame backup unit 130 (122).

Figure 2:
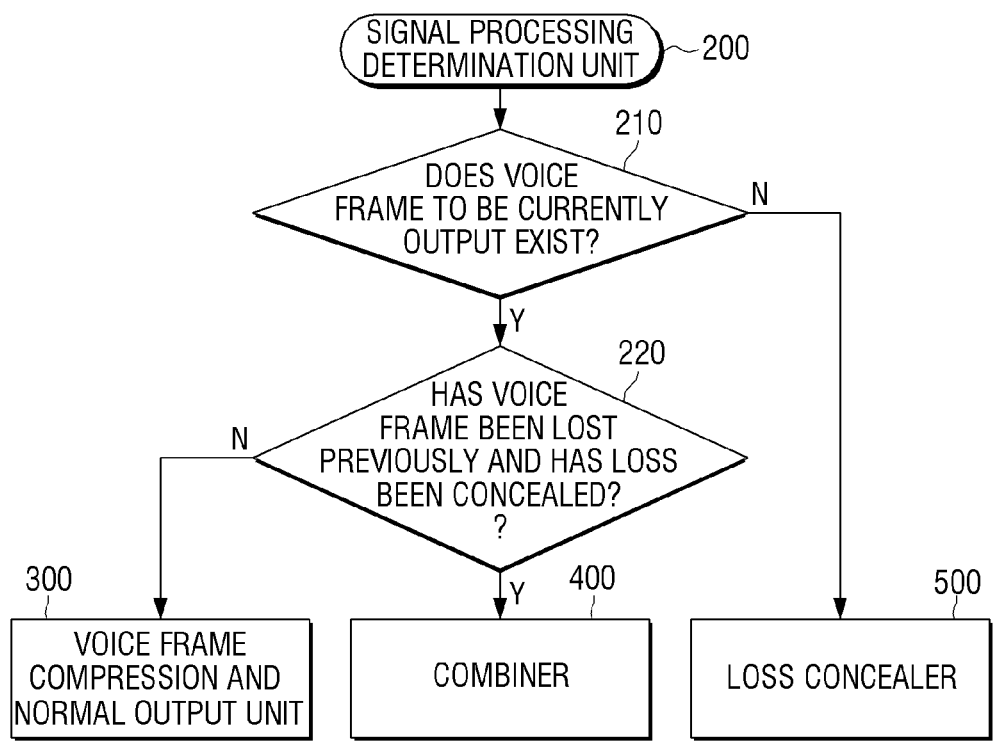
FIG. 2 is a view to explain an operation of a signal processing determination unit 200 according to an exemplary embodiment.

FIG. 2 is a view to explain an operation of the signal processing determination unit 200 according to an exemplary embodiment.

Referring to FIG. 2, the operations of the signal processing determination unit 200 vary according to whether there is a voice frame to be currently output (210) and according to whether a previous voice frame is lost (220).

If a voice frame exists in the output voice frame storage 120 (210: Y) and if a loss of a previous voice frame is not concealed by the loss concealer 500 (220: N), the voice frame is transmitted to the voice frame compression and normal output unit 300. Configuration and operation of the voice frame compression and normal output unit 300 will be explained in detail below with reference to FIG. 3.

If a voice frame to be output does not exist in the output voice frame storage 120 (210: N), the loss concealer 400 generates a loss concealment signal to output a signal. Configuration and operation of the loss concealer 400 will be explained in detail below with reference to FIG. 4.

If a voice frame exists in the output voice frame storage 120 (210: Y) and if a loss of a previous voice frame is concealed by the loss concealer 400 (220: Y), the voice frame is transmitted to the combiner 500 so that the voice frame loss-concealed by the loss concealer 400 and a discontinuous point are removed. Configuration and operation of the combiner 500 will be explained in detail below with reference to FIG. 5.

Figure 3:
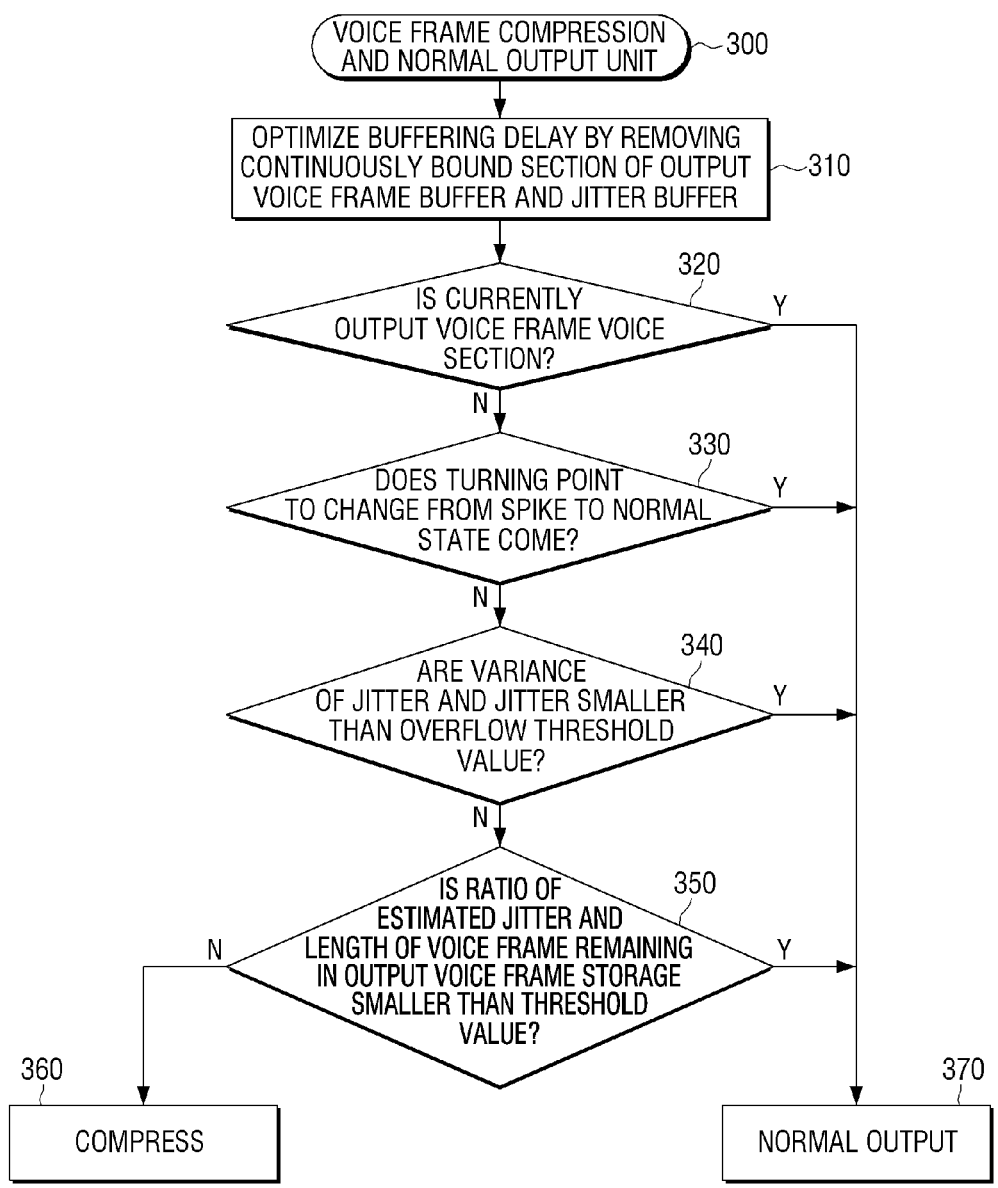
FIG. 3 is a view to explain an operation of a voice frame compression and normal output unit 300 according to an exemplary embodiment.

FIG. 3 is a view to explain an operation of the voice frame compression and normal output unit 300 according to an exemplary embodiment.

Referring to FIG. 3, the operations of the voice frame compression and normal output unit 300 vary according to whether an IP network is changed from a spike state to a normal state, or is maintained in the normal state.

If the IP network is changed from the spike state to the normal state, the voice frame compression and normal output unit 300 finds a continuous non-voice section stored in the jitter buffer 100 and the output voice frame storage 120, and compresses the continuous non-voice section in order to prevent a buffering delay from being increased due to a voice packet suddenly coming after the spike. If a voice frame does not exist in the output voice frame storage 120 and a voice packet exists in the jitter buffer 100, the voice frame compression and normal output unit 300 requests decoding of the continuous packets stored in the jitter buffer 100 (301) and converts the packets into voice frames, and determines whether the voice frame is a voice section or a non-voice section through the voice divider 115.

If it is determined that the decoded voice frame is a non-voice section, the voice frame compression and normal output unit 300 optimizes the buffering delay by compressing the continuous non-voice section (310). On the other hand, if the voice frame to be currently output is a voice section rather than a non-voice section, the voice frame compression and normal output unit 300 normally outputs the voice frame without compressing it (370). Thus, distortion of a voice signal is prevented, which may undermine voice quality due to compression in a voice section.

If the voice frame to be currently output is a non-voice section, the voice frame compression and normal output unit 300 checks whether the IP network reaches a turning point to be changed from the spike state to the normal state, based on jitter information prior to determining whether to compress or normally output the voice frame (330). The jitter and the variance of the jitter estimated at the turning point are values that are estimated using information on a jitter average and a variance of a previous normal state, and do not sufficiently reflect a current network situation. Therefore, the voice frame is normally output in order to prevent the jitter estimated at the turning point from being reflected and incorrect compression determination.

The voice frame compression and normal output unit 300 excludes a jitter estimating error, which may be caused at the turning point, and then compares the currently estimated jitter and the variance of the jitter with an overflow threshold value (340), and determines whether to compress the non-voice section to be currently output (360) or normally output the non-voice section (370). In other words, if the currently estimated jitter and the variance of the jitter are smaller than the overflow threshold value, it is estimated that the current network situation is very good and the jitter is less likely to be changed, and it is determined that an overflow does not occur only by normal output, and normal output is performed (370). On the other hand, if the currently estimated jitter and the variance of the jitter are larger than the overflow threshold value, it is estimated that the network is unstable and the jitter is more likely to be changed, and the estimated jitter is compared with a ratio of a length of a voice frame existing in the receiving end and it is determined whether to compress or normally output the voice frame in the unstable network situation.

If the estimated jitter and the ratio of the length of the voice frame existing in the receiving end are smaller than a normal output threshold value (350), the voice frame compression and normal output unit 300 determines that a voice frame to be normally output exists in the receiving end until a next packet arrives at the receiving end and that an additional voice frame exists and packets are stacked, and performs compression (360). On the other hand, if the estimated jitter and the ratio of the length of the voice frame existing in the receiving end are larger than the normal output threshold value (350), the voice frame compression and normal output unit 300 determines that only the voice frame to be normally output exists until the next voice packet arrives, and thus performs normal output (370).

As described above, the voice frame compression and normal output unit 300 determines whether to compress or normally output the voice frame existing in the receiving end, according to a jitter result of estimating a next network situation, such that balance between a buffering delay and sound quality improvement can be optimized.

Figure 4:
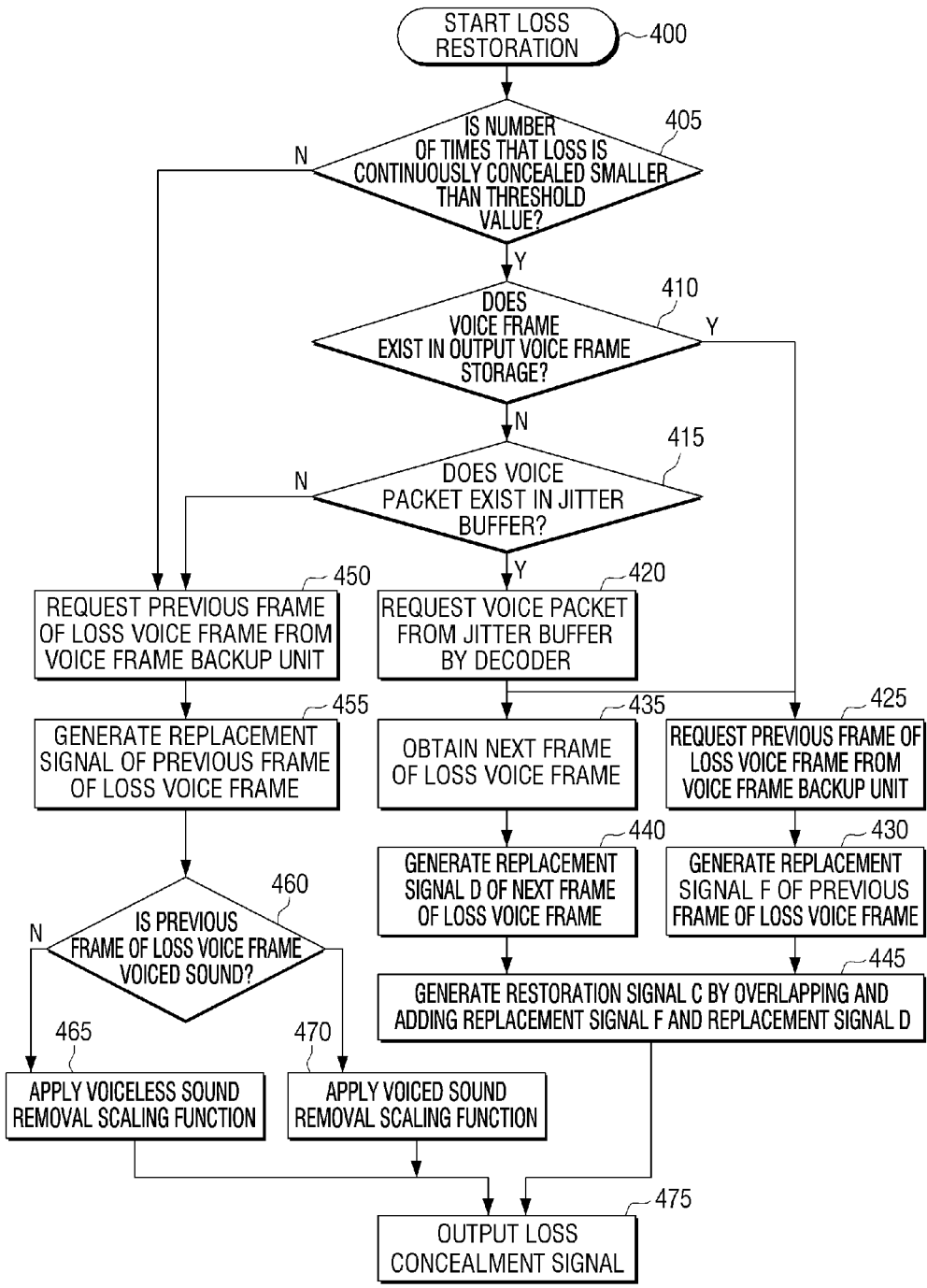
FIG. 4 is a view to explain an operation of a loss concealer 400 according to an exemplary embodiment.

FIG. 4 is a view to explain an operation of the loss concealer 400 according to an exemplary embodiment.

Referring to FIG. 4, the loss concealer 400 performs short-term loss concealment or long-term loss concealment according to a number of times that a continuous loss is concealed (405).

If the number of times that the continuous loss is concealed is smaller than a sound quality damage threshold value, the loss concealer 400 performs short-term loss concealment. In this case, the sound quality damage threshold value regarding the number of times that the continuous loss is concealed may be obtained by conducting an experiment. For example, the sound quality damage threshold value may be obtained from 20 listeners.

The short-term loss concealment is performed differently according to whether a voice frame exists in the output voice frame storage 120 (410), and according to whether a voice packet to be output exists in the jitter buffer (415).

If the short-term loss concealment is performed, it is determined whether a voice frame to be output exists in the output voice frame storage 120 (410). If a voice frame does not exist in the output voice frame storage 120 and a voice packet to be output does not exist in the jitter buffer 100, since there is only a voice frame normally received before the loss and stored in the voice frame backup unit 130 as a voice frame for restoring the lost voice frame, a replacement signal of the lost voice frame is generated (455) using the voice frame normally received before the loss (455). If the voice frame normally received before the loss and used for concealing the packet is an unvoiced sound, a sharply reducing unvoiced sound removal scaling function is applied (465), and, if the voice frame is a voiced sound, the reducing scaling function is not applied (470). The loss-concealed voice frame is output through the receiving end output apparatus 135 (475).

If a voice frame does not exist in the output voice frame storage 120 and a voice packet to be output exists in the jitter buffer 100, the voice packet is requested by the decoder 110 (420) and the packet existing in the jitter buffer 100 is decoded as a voice frame, and is stored in the voice frame storage 120. Then, a concealment signal is generated using a voice frame, normally received before the loss and a voice frame normally after the loss, and the loss-concealed voice frame is output through the receiving end output apparatus 135 (475).

In other words, a replacement signal F is generated using a voice frame normally received before the loss (430), and a replacement signal D is generated using a voice frame normally received after the loss (440). Next, a section similar to the replacement signal D is searched in the replacement signal F, and a loss concealment signal is generated by overlapping and adding the replacement signals F and D in the searched similar section.

The generated concealment signal outputs the loss-concealed voice frame through the receiving end output apparatus 135 (475). If the voice frame normally received before the loss and used for concealing the loss is an unvoiced sound, an unvoiced sound removal scaling function is applied (465). In other words, a sharply reducing scaling function is applied. Also, if the voice frame normally received before the loss and used for concealing the loss is a voiced sound, a voiced sound removal scaling function is applied (470). In other words, the sharply reducing scaling function is not applied. The voice frame which has been loss-concealed as described above is output through the receiving end output apparatus 135 (475).

On the other hand, if the long-term packet loss occurs (405: N), a lost packet section is repeatedly replaced using only a voice frame normally received before the loss like in the short-term section. Thus, a buzz sound which rapidly damages sound quality due to repeated equal signals or similar signals is generated. In order to remove such a buzz sound, the unvoiced sound removal scaling function is applied as 0 if the voice frame normally received before the loss and used for concealing the packet is an unvoiced sound (465), and the voiced sound removal scaling function, which is sharply reduced after a long-term start packet, is applied if the voice frame is a voiced sound (470). The voice frame from which the buzz sound has been removed is output through the receiving end output apparatus 135 (475).

Although not shown, if the number of times that the continuous loss is concealed is smaller than the threshold value (S405: N), i.e., if the long-term loss concealment is performed, it is determined whether a voice frame exists in the output voice frame storage in the same way as in the short-term loss concealment. If it is determined that a voice frame exists in the output voice frame storage, a previous frame of a lost voice frame is requested from the voice frame backup unit (450), and a replacement signal of the previous frame of the lost voice frame is generated (455).

The unvoiced sound removal scaling function and the voiced sound removal scaling function used for the short-term and long-term packet loss concealment may be obtained by conducting an experiment. According to an exemplary embodiment, a buzz sound removal function generated by measuring a listening effect from 20 listeners is used.

Figure 5:
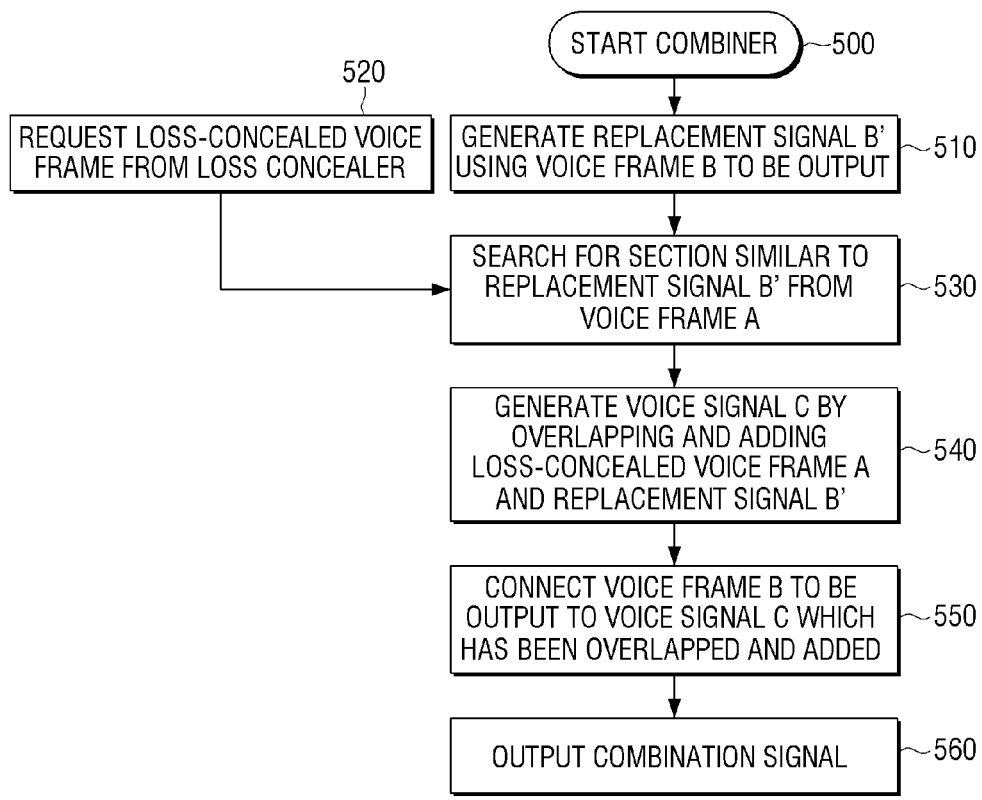
FIG. 5 is a view to explain an operation of a combiner 500 according to an exemplary embodiment.

FIG. 5 is a view to explain an operation of the combiner 500 according to an exemplary embodiment.

Referring to FIG. 5, the combiner 500 obtains the loss-concealed voice frame and simultaneously obtains the normally received voice frame from the output voice frame storage 120.

A combination signal from which a discontinuous point is removed by directly overlapping and adding the loss-concealed voice frame and the normally received voice frame may deform the normally received voice frame. Thus, the voice frame may be distorted. In order to prevent the distortion of the voice frame which causes sound quality to deteriorates, a replacement signal for being overlapped and added is generated by extracting a sub-frame from the normally received voice frame (510). A similar section is searched in the loss-concealed voice signal using the generated replacement signal, and the loss-concealed voice frame and the replacement signal are overlapped and added together using the searched similar section. A final combination signal is generated (550) by connecting the normally received voice frame to the voice frame from which a discontinuous point is removed by overlapping and adding the loss-concealed voice frame and the replacement signal (550), and the generated combination signal is output through the receiving end output apparatus 135 (560). As described above, the replacement signal is generated (510) and is overlapped and added with the loss-concealed voice frame (540) such that deformation of the normally received voice frame, which may be caused by directly overlapping and adding the loss-concealed voice frame and the normally received voice frame, can be prevented. Thus, sound quality can be improved.

Hereinafter, the operation of concealing a loss using a voice frame normally received before the loss and a voice frame normally received after the loss will be explained with reference to FIGS. 6 and 7.

Figure 6:
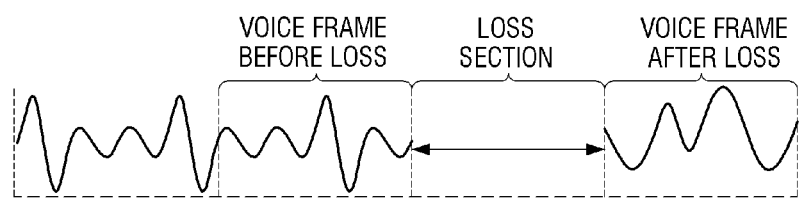
FIGS. 6 and 7 are views to explain a method for concealing loss using a voice frame normally received before loss and a voice frame normally received after loss.

Referring to FIG. 6, a current packet is lost and a loss section is generated. A voice frame normally received before the loss is obtained from the voice frame backup unit 130 (425), and simultaneously a voice frame normally received after the loss is obtained from the output voice frame storage 120 (435).

Figure 7:
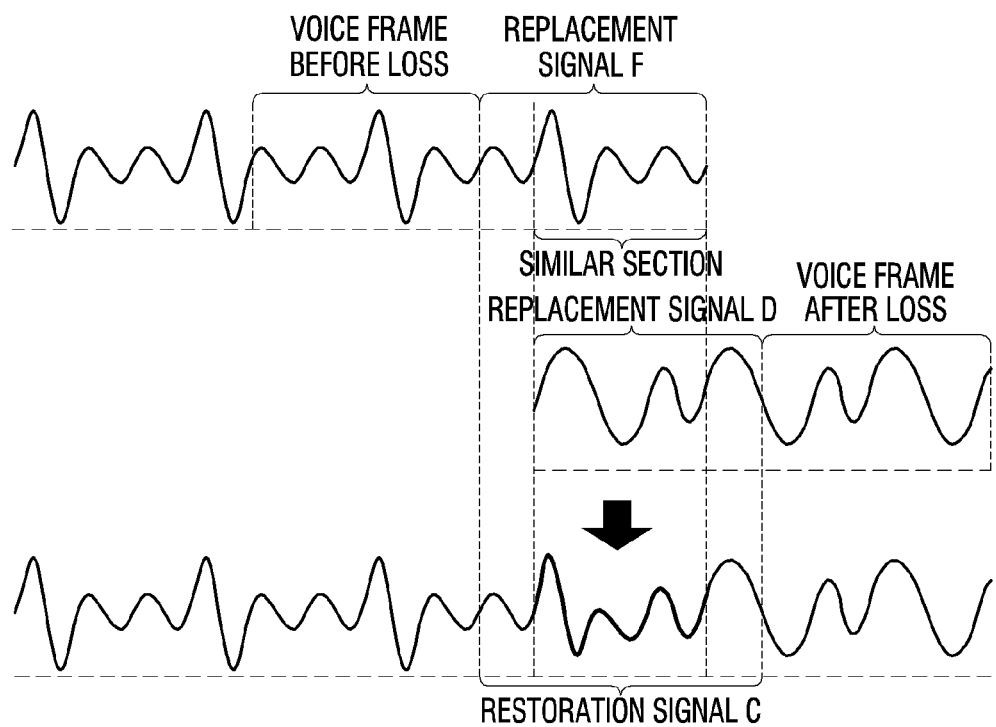

Referring to FIG. 7, a replacement signal F is generated using the voice frame normally received before the loss (430), and a replacement signal D is generated using the voice frame normally received after the loss (440). A section similar to the replacement signal D is searched in the replacement signal F and a loss concealment signal is generated by overlapping and adding the replacement signal F and the replacement signal D in the similar section (445).

The operation of combining using a replacement signal of a normally received voice frame will be explained with reference to FIG. 8.

Figure 8:
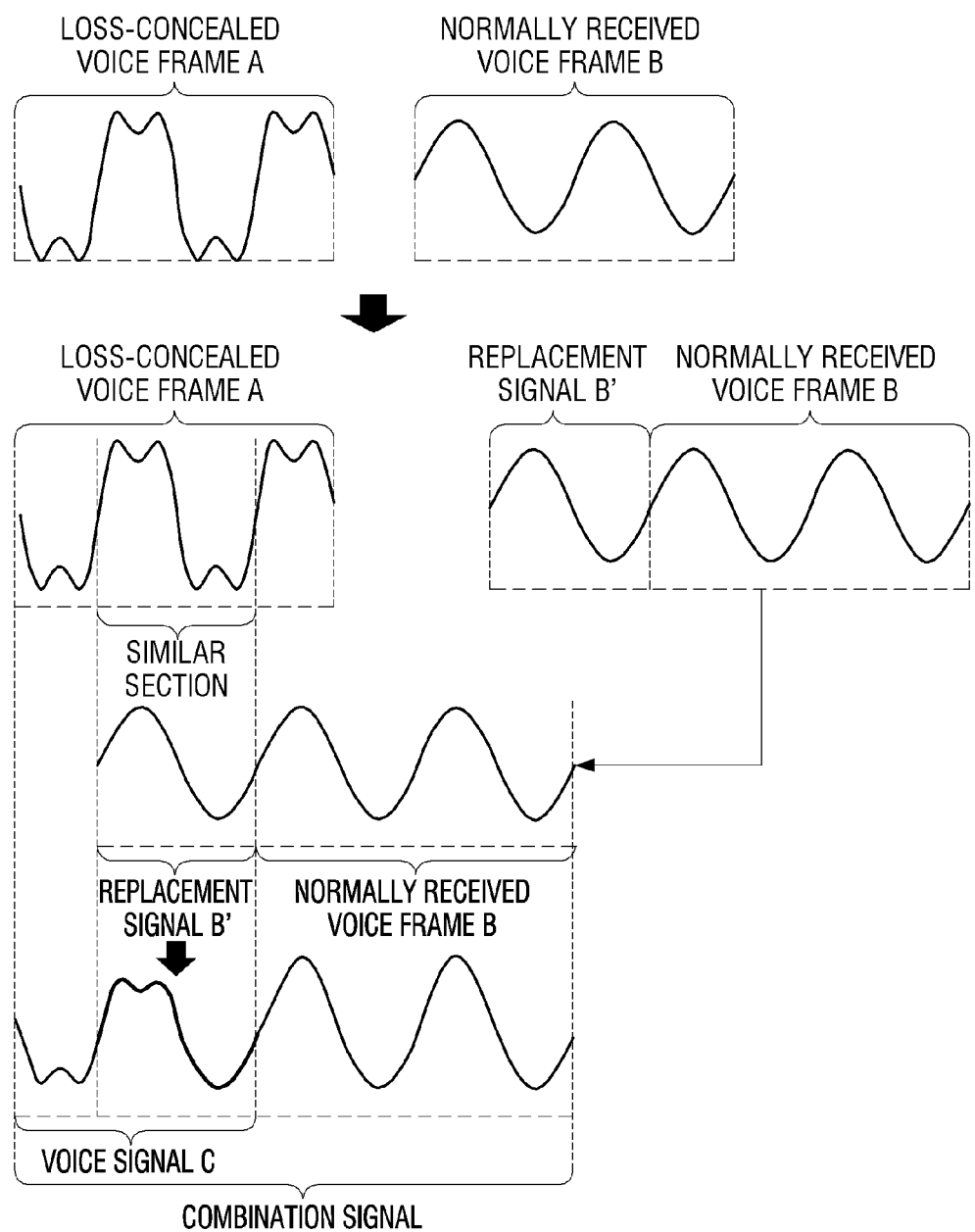
FIG. 8 is a view to explain an operation of combining using a replacement signal of a normally received voice frame.

Referring to FIG. 8, a loss-concealed voice frame A and a normally received voice frame B are obtained. A replacement signal B' for being overlapped and added is generated by extracting a sub-frame from the voice frame B (510). A section similar to the replacement signal B' is searched in the voice frame A (530), and a voice signal C from which a discontinuous point of the loss-concealed voice frame A is removed is generated by overlapping and adding the voice frame A and the replacement signal B' in the searched similar section as much as a length of the replacement signal B' (540). A final combination signal is generated by connecting the voice signal C and the normally received voice frame B (550).

Figure 9:
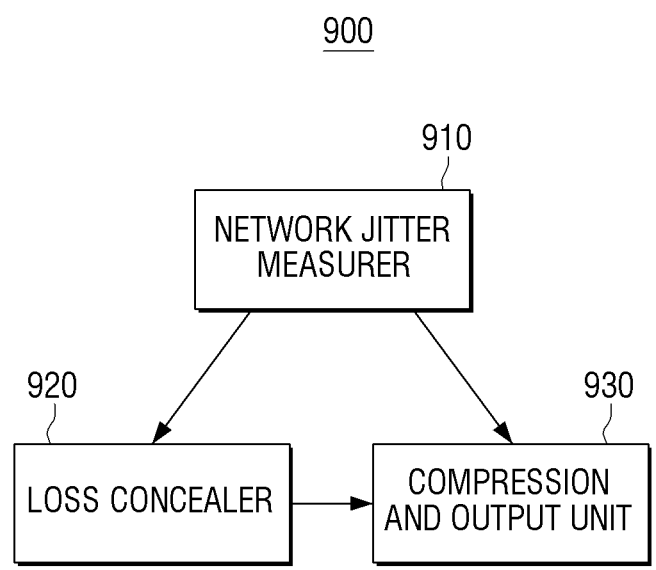
FIG. 9 is a block diagram illustrating a signal processing apparatus according to another exemplary embodiment.

FIG. 9 is a block diagram illustrating a signal processing apparatus according to another exemplary embodiment.

Referring to FIG. 9, a signal processing apparatus according to another exemplary embodiment includes a network jitter measurer 910, a compression and output unit 920, and a loss concealer 930.

The network jitter measurer 910 estimates network jitter using an optimal weighting of a network jitter variance. The network jitter refers to a variance of interarrival intervals of packets and exists only in a packet-based network. If jitter is generated in voice communication using a VoIP, a receiver cannot reproduce a packet arriving late when reproducing the packets, such that voice quality deteriorates. In order to remove such a jitter phenomenon, a jitter buffer may be used. The jitter buffer may include a static jitter buffer and a dynamic jitter buffer.

The optimal weighting of the jitter variance may be a weighting that can minimize a difference between previously estimated network jitter and currently generated network jitter.

Specifically, the network jitter measurer 910 may detect a spike state in which network jitter is abruptly changed using header information of a received voice packet and the optimal weighting of the jitter variance.

The network jitter measurer 910 divides a network state into a spike state and a normal state, and may minimize a jitter estimating error using a jitter average and a jitter variance of the current network jitter, and the optimal weighting of the jitter variance according to each network state.

The network jitter measurer 910 detects a change from the normal state to the spike state using information on the normally received packet, temporarily stores an average and a variance of network jitter of the previous normal state when detecting the spike state, and estimates jitter of a normal state using the average and the variance of the network jitter temporarily stored when the spike state is changed to the normal state. In this case, the network jitter measurer 910 may calculate the optimal weighting of the jitter variance by calculating an error between network jitter estimated in each of the normal state and the spike state, and real network jitter, If there is a voice packet loss, the loss concealer 920 divides the voice packet loss into short-term loss concealment and long-term loss concealment, and performs loss concealment in a different way. In this case, the loss concealer 920 is implemented separately from a decoder, which decodes a received voice packet and generates a voice frame, and may restore the lost voice packet regardless of a type of the decoder.

If the voice packet loss corresponds to the short-term loss concealment, and if a voice frame does not exist after the lost voice frame, the loss concealer 920 restores the lost voice frame using only a pre-loss voice frame. If a voice frame exists after the lost voice frame, the loss concealer 920 restores the lost voice frame using the pre-loss voice frame and the post-loss voice frame. If a post-loss voice frame does not exist in the voice frame buffer, the loss concealer 630 searches a post-loss voice frame in the jitter buffer, decodes the voice frame, and uses the voice frame to restore the lost voice frame.

Also, if the pre-loss voice frame used for the short-term loss concealment is an unvoiced sound, the loss concealer 920 applies an unvoiced sound removal scaling function which is reduced with a slope more than a predetermined threshold value. If the pre-loss voice frame is a voiced sound, the loss concealer 920 may not apply the reducing scaling function.

If the voice packet loss corresponds to the long-term loss concealment, the loss concealer 920 may divide a voice section into a voiced sound section and an unvoiced sound section, and may apply a removal scaling function corresponding to each section.

The compression and output unit 930 compresses or outputs the voice frame based on the network jitter estimated by the network jitter measurer 910 and the loss concealment signal generated by the loss concealer 920.

In particular, the compression and output unit 930 may compress or output the voice frame using the spike state detected by the network jitter measurer 910.

Specifically, the compression and output unit 930 may compress the voice frame according to whether the spike state is changed to the normal state or the normal state is maintained.

Also, the compression and output unit 930 may divide the voice frame into a non-voice section and a voice section when compressing it, and does not compress the voice section and compresses only the non-voice section.

In this case, the compression and output unit 930 finds a continuous non-voice section of the output voice frame buffer and the jitter buffer if the spike state is changed to the normal state, and compresses the continuous non-voice section. Thus, a buffering delay can be reduced.

Also, although not shown, the signal processing apparatus may further include a combiner (not shown) which extracts a sub-frame from a normally received voice frame, and generates a combined voice frame by combining the voice frame loss-concealed by the loss concealer and the extracted sub-frame.

FIG. 10 is a flowchart to explain a signal processing method according to an exemplary embodiment.

According to the signal processing method as shown in FIG. 10, network jitter is estimated using a weighting of a jitter variance according to a network state (S1010).

If there is a voice packet loss, loss concealment is performed in different ways according to whether the loss is short-term loss concealment or long-term loss concealment, and a loss concealment is generated (S1020). In this case, the loss concealer to perform loss concealment is separated from the decoder, which decodes a received voice packet, and generates a voice frame. Thus, the loss concealer may restore the lost voice packet, regardless of a type of the decoder. The voice packet may be a voice communication packet according to a VoIP.

Next, the voice frame is compressed or output based on the estimated network jitter, and the generated loss concealment signal (S1030).

In operation S1010 of estimating the network jitter, a spike state in which the network jitter is abruptly changed may be detected using header information of the received voice packet and the weighting of the jitter variance. In this case, in operation S1030 of compressing or outputting, the received voice packet may be compressed or output using the detected spike state.

In this case, the weighting of the jitter variance may be a weighing that can minimize a difference between previously estimated network jitter and currently generated network jitter.

In operation S1010 of estimating the network jitter, a network state may be divided into a spike state and a normal state, and a jitter estimating error may be minimized using a jitter average and a jitter variance of current network jitter according to each network state, and a weighting of the network variance according to the network state.

Specifically, in operation S1010 of estimating the network jitter, a change from the normal state to the spike state is detected using normally received packet information, and an average and a variance of network jitter of the previous normal state are temporarily stored when the spike state is detected, and, when the spike state is changed to the normal state, jitter of the normal state is estimated using the average and the variance of the network jitter temporarily stored. Also, a weighting of a jitter variance may be calculated by calculating an error between network jitter estimated in each of the normal state and the spike state and real network jitter.

In operation S1020 of performing the loss concealment, if the loss corresponds to the short-term loss concealment, and if a voice frame does not exist after the lost voice frame, the lost voice frame is restored using only a pre-loss voice frame, and, if a voice frame exists after the lost voice frame, the lost voice frame is restored using the pre-loss voice frame and the post-loss voice frame.

In operation S1020 of performing the loss concealment, if a post-loss voice frame does not exist in the voice frame buffer, a post-loss voice frame is searched in the jitter buffer, decoded, and used for restoring the lost frame.

In operation S1020 of performing the loss concealment, if the pre-loss frame used for the short-term loss concealment is an unvoiced sound, an unvoiced sound removal scaling function, which is reduced with a slope more than a predetermined threshold value is applied, and, if the pre-loss frame is a voiced sound, the reducing scaling function may not be applied.

In operation S1020 of performing the loss concealment, if the loss corresponds to the long-term loss concealment, a voice section is divided into a voiced sound second and an unvoiced sound section, and a removal scaling function corresponding to each section may be applied.

A sub-frame is extracted from the normally received voice frame, and a combined voice frame is generated by combining the voice frame loss-concealed by the loss concealer and the extracted sub-frame.

Also, in operation S1030 of compressing or outputting the voice frame, the voice frame may be compressed according to whether the spike state is changed to the normal state or the normal state is maintained. Also, in operation S1030 of compressing or outputting the voice frame, the voice frame may be divided into a non-voice section and a voice section when being compressed, and the voice section may not be compressed and the non-voice section may be compressed.

In operation S1030 of compressing or outputting the voice frame, if the spike state is changed to the normal state when the voice frame is compressed, a continuous non-voice section of the output voice frame buffer and the jitter buffer is found and compressed, such that a buffering delay can be reduced.

The method for improving mobile VoIP voice quality through adaptive playout scheduling and packet loss concealment, according to an exemplary embodiment described above, may suggest four improved methods for improving sound quality using only signal processing operations at the receiving end.

First, a turning point to change from a network normal state to a spike state, and from a spike state to a normal state is swiftly detected, using information on packets arriving at the receiving end and an optimal weighing function of a dynamic jitter variance, such that an error for estimating jitter in a next network state can be reduced and a balance between a buffering delay and sound quality improvement can be maintained.

Second, packets of the receiving end are compressed or normally output in a jitter estimating method of high accuracy without being expanded, such that a buffering delay can be reduced and sound quality can be improved. Also, only a non-voice section other than a voice section is compressed, such that balance between a buffering delay and sound quality improvement can be maintained.

Third, if there is a packet loss, the packet loss is divided into short-term loss concealment and long-term loss concealment in order to conceal the lost packet, and each packet loss concealing method is applied such that a buzz sound can be removed and sound quality can be improved.

Fourth, when a previous packet that has been lost and restored is combined with a currently received packet, the normally received packet is combined with the previously restored packet without being distorted, such that the sound quality can be improved.

According to the above-described method, jitter is estimated based on an optimal weighting of a jitter variance, such that a jitter estimating error can be minimized, and a buffering delay and packet loss can be minimized by playout scheduling using the same.

Also, since the packets are compressed or normally output without being expanded, an unnecessary increase in a buffering delay and distortion of the voice frame caused by expanding can be prevented. Also, the compression is performed differently according to a voice section or a non-voice section, and a continuous non-voice section is compressed, such that a buffering delay can be efficiently reduced and sound quality can be prevented from deteriorating.

Also, a continuous loss section is sensed when the loss concealment is performed and is divided into short-term loss concealment and long-term loss concealment, and a removal scaling function is applied to the loss-concealed voice frame, such that a buzz sound can be prevented from being generated due to long-term packet concealment and sound quality can be prevented from deteriorating.

Also, after the loss concealment, the normally received voice frame is combined using a sub-frame, such that distortion of the normally received voice frame can be prevented and sound quality can be improved.

The signal processing method according to the above-described various exemplary embodiments may be implemented as a program, and may be provided to a receiving apparatus or a signal processing apparatus.

For example, a non-transitory computer readable medium may be provided which stores a program performing: estimating network jitter using a weighting of a network jitter variance; compressing or outputting a voice frame based on the estimated network jitter; and, if there is a voice packet loss, dividing the voice packet loss into short-term loss concealment and long-term loss concealment, and performing loss concealment in a different way.

The non-transitory computer readable medium refers to a medium that stores data semi-permanently, rather than storing data for a very short time, such as a register, a cache, and a memory, and is readable by an apparatus. Specifically, the above-described various applications or programs may be stored and provided in a non-transitory computer readable medium, such as a compact disc (CD), a digital versatile disk (DVD), a hard disk, a Blu-ray disk, a universal serial bus (USB) memory stick, a memory card, and a read only memory (ROM).

The foregoing exemplary embodiments and advantages are merely exemplary. The exemplary embodiments can be readily applied to other types of apparatuses. Also, the description of the exemplary embodiments is intended to be illustrative, and not to limit the scope of the claims. Many alternatives, modifications, and variations will be apparent to those skilled in the art.

What is claimed is:

1. A signal processing apparatus which processes a voice packet, comprising:
   a network jitter measurer which estimates network jitter using information on a received voice packet and a weighting of a network jitter variance and determines a network state by comparing the estimated network jitter with a spike detection threshold value;
   a loss concealer which divides a voice packet loss into short-term loss concealment and long-term loss concealment when there is the voice packet loss, and generates a loss concealment signal by performing loss concealment in a different way depending on whether the voice packet loss is the short-term loss concealment or the long-term loss concealment; and
   a compression and output unit which compresses or outputs a voice frame based on the network state and the loss concealment signal.

2. The signal processing apparatus as claimed in claim 1, further comprising a decoder which decodes the received voice packet and generates the voice frame,
   wherein the loss concealer restores the voice packet loss.

3. The signal processing apparatus as claimed in claim 1, wherein the network jitter measurer detects a spike state in which the network jitter is abruptly changed using header information of the received voice packet and the weighting of the jitter variance,
   wherein the compression and output unit compresses or outputs the voice frame using the detected spike state.

4. The signal processing apparatus as claimed in claim 1, wherein the network jitter measurer weighs the jitter variance by minimizing a difference between previously estimated network jitter and currently generated network jitter.

5. The signal processing apparatus as claimed in claim 1, wherein the network jitter measurer divides the network state into a spike state and a normal state, and minimizes a jitter estimating error using a jitter average and the network jitter variance according to each network state, and the weighting of the jitter variance.

6. The signal processing apparatus as claimed in claim 5, wherein the network jitter measurer detects a change from the normal state to the spike state using information on a normally received packet, temporarily stores an average and a variance of the network jitter in a previous normal state when detecting the spike state, estimates jitter of the normal state using the average and the variance of the network jitter temporarily stored when the spike state is changed to the normal state, and calculates the weighting of the jitter variance by calculating an error between the network jitter estimated in each of the normal state and the spike state, and a real network jitter.

7. The signal processing apparatus as claimed in claim 1, wherein the compression and output unit compresses the voice frame according to whether a spike state is changed to a normal state or a normal state is maintained, divides the voice frame into a non-voice section and a voice section when compressing the voice frame, and does not compress the voice section and compresses the non-voice section.

8. The signal processing apparatus as claimed in claim 7, wherein the compression and output unit searches a continuous non-voice section of an output voice frame buffer and a jitter buffer when the spike state is changed to the normal state, and compresses the continuous non-voice section such that a buffering delay is reduced.

9. The signal processing apparatus as claimed in claim 1, wherein, the loss concealer restores the lost voice frame using only a pre-loss voice frame when the voice packet loss corresponds to the short-term loss concealment, and the voice frame does not exist after a lost voice frame,
   wherein the loss concealer restores the lost voice frame using a pre-loss voice frame and a post-loss voice frame when the voice frame exists after the lost voice frame, and
   wherein the loss concealer searches a post-loss voice frame in a jitter buffer, decodes the voice frame, and uses the voice frame to restore the lost voice frame when the post-loss voice frame does not exist in the voice frame.

10. The signal processing apparatus as claimed in claim 9, wherein, the loss concealer applies an unvoiced sound removal scaling function when the pre-loss frame used for the short-term loss concealment is an unvoiced sound, and
   wherein the loss concealer does not apply the unvoiced sound removal scaling function when the pre-loss frame is a voiced sound.

11. The signal processing apparatus as claimed in claim 9, wherein, the loss concealer divides a voice section into a voiced sound section and an unvoiced sound section, and applies a removal scaling function corresponding to each section of the voiced sound section and the unvoiced sound section when the voice packet loss corresponds to the long-term loss concealment.

12. The signal processing apparatus as claimed in claim 1, wherein the network jitter measurer receives a voice communication packet according to a VoIP as the received voice packet.

13. A signal processing apparatus which processes a voice packet, comprising:
   a network jitter measurer which estimates network jitter using information on a received voice packet and a weighting of a network jitter variance;
   a loss concealer which divides a voice packet loss into short-term loss concealment and long-term loss concealment when there is the voice packet loss, and generates a loss concealment signal by performing loss concealment in a different way depending on whether the voice packet loss is the short-term loss concealment or the long-term loss concealment;

a compression and output unit which compresses or outputs a voice frame based on the estimated network jitter and the loss concealment signal; and a combiner which extracts a sub-frame from a normally received voice frame, and generates a combined voice frame by combining the voice frame which is loss-concealed by the loss concealer and the extracted sub-frame.

14. A method for processing a signal, which processes a voice packet, the method comprising:

estimating network jitter using information on a received voice packet and a weighting of a network jitter variance;

dividing a voice packet loss into short-term loss concealment and long-term loss concealment when there is the voice packet loss, and generating a loss concealment signal by performing loss concealment in a different way depending on whether the voice packet loss is the short-term loss concealment or the long-term loss concealment;

comparing the estimated network jitter with an overflow threshold value; and compressing or outputting a voice frame based on the comparison.

15. The method as claimed in claim 14, further comprising decoding the received voice packet and generating the voice frame, wherein the generating the loss concealment signal comprises restoring the voice packet loss.

16. The method as claimed in claim 14, wherein the estimating the network jitter comprises detecting a spike state in which the network jitter is abruptly changed using header information of the received voice packet and the weighting of the jitter variance, wherein the compressing or outputting comprises compressing or outputting the received voice frame using the detected spike state.

17. The method as claimed in claim 14, wherein the weighting of the jitter variance comprises minimizing a difference between previously estimated network jitter and currently generated network jitter.

18. The method as claimed in claim 14, wherein the estimating the network jitter comprises dividing a network state into a spike state and a normal state, and minimizing a jitter estimating error using a jitter average and the network jitter variance according to each network state, and the weighting of the jitter variance.

19. The method as claimed in claim 18, wherein the estimating the network jitter comprises:

detecting a change from the normal state to the spike state using information on a normally received packet;

temporarily storing an average and a variance of the network jitter in a previous normal state when detecting the spike state, and estimating jitter of the normal state using the average and the variance of the network jitter temporarily stored when the spike state is changed to the normal state; and calculating the weighting of the jitter variance by calculating an error between the network jitter estimated in each of the normal state and the spike state and a real network jitter.

20. The method as claimed in claim 14, wherein the compressing and outputting comprises compressing the voice frame according to whether a spike state is changed to a normal state or a normal state is maintained, dividing the voice frame into a non-voice section and a voice section when compressing the voice frame, and not compressing the voice section and compressing the non-voice section.

* * * * *